United States Patent
Vendier et al.

(10) Patent No.: US 10,340,567 B2
(45) Date of Patent: Jul. 2, 2019

(54) MICROWAVE SWITCHING DEVICE WITH THE STATE OF THE CONNECTIONS OF THE INPUTS AND OUTPUTS BEING READ BY TELEMETRY

(71) Applicant: THALES, Courbevoie (FR)

(72) Inventors: Olivier Vendier, Aureville (FR); Raoul Rodriguez, Bruguieres (FR); Pierre-Yves Chabaud, Toulouse (FR); Dominique Potuaud, La Salvetat Saint Gilles (FR); Jérôme Battut, Toulouse (FR); Johann Bornet, Ramonville Saint Agne (FR); Thierry Adam, Tournefeuille (FR); Jean-François Villemazet, Cintegabelle (FR); François Grojean, Portet sur Garonne (FR)

(73) Assignee: THALES, Courbevoie (FR)

( * ) Notice: Subject to any disclaimer, the term of this patent is extended or adjusted under 35 U.S.C. 154(b) by 4 days.

(21) Appl. No.: 15/917,448

(22) Filed: Mar. 9, 2018

(65) Prior Publication Data
US 2018/0269552 A1 Sep. 20, 2018

(30) Foreign Application Priority Data
Mar. 16, 2017 (FR) .................................... 17 00276

(51) Int. Cl.
| | |
|---|---|
| *H01P 1/10* | (2006.01) |
| *H04B 7/185* | (2006.01) |
| *H01P 1/12* | (2006.01) |
| *H01H 1/00* | (2006.01) |
| *H03K 17/18* | (2006.01) |

(52) U.S. Cl.
CPC ........... *H01P 1/127* (2013.01); *H01H 1/0036* (2013.01); *H03K 17/18* (2013.01); *H04B 7/18515* (2013.01); *H01H 2001/0042* (2013.01); *H01P 1/125* (2013.01)

(58) Field of Classification Search
CPC .................................. H01P 1/10; H04B 7/185
See application file for complete search history.

(56) References Cited

U.S. PATENT DOCUMENTS

| 4,430,732 A * | 2/1984 | Saga ...................... H03K 17/62 |
| | | 370/323 |
| 6,888,420 B2 * | 5/2005 | Schaffner ................ H01P 1/127 |
| | | 333/101 |
| 2004/0095205 A1 | 5/2004 | Schaffner et al. |
| 2004/0263297 A1 | 12/2004 | Glukh et al. |

OTHER PUBLICATIONS

C. Patel et al., "A High-Reliability High-Linearity High-Power RF MEMS Metal-Contact Switch for DC 40-GHz Applications," IEEE Transactions on Microwave Theory and Techniques, vol. 60, No. 10, Oct. 1, 2012, pp. 3096-3112, XP011465683.

* cited by examiner

Primary Examiner — Dean O Takaoka
(74) *Attorney, Agent, or Firm* — Baker & Hostetler LLP

(57) ABSTRACT

A microwave switching device comprises: a switching matrix with M inputs and N outputs comprising at least one surface-mount microwave switch with ohmic contacts with at least one input and at least one output position; a control bus for the one or more microwave switches of the switching matrix; a telemetry bus for the M inputs; a telemetry bus for the N outputs; a bias tee positioned on each input of the switching matrix; and a bias tee positioned on each output of the switching matrix.

9 Claims, 5 Drawing Sheets

MICROWAVE SWITCHING DEVICE WITH THE STATE OF THE CONNECTIONS OF THE INPUTS AND OUTPUTS BEING READ BY TELEMETRY

CROSS-REFERENCE TO RELATED APPLICATIONS

This application claims priority to foreign French patent application No. FR 1700276, filed on Mar. 16, 2017, the disclosure of which is incorporated by reference in its entirety.

FIELD OF THE INVENTION

The field of the invention is that of equipment intended to be installed on board satellites, more specifically microwave equipment configured in an assembly such as frequency conversion chains in concert with payloads.

BACKGROUND

The specifications in terms of data rate of new telecommunication satellites entail the presence of a large number of items of microwave equipment, such as conversion chains, which must often be redundant so as to observe reliability specifications.

The centralization of redundancy in a satellite presents technical difficulties which may limit the complexity of the payload, increase its cost, or else decrease its reliability by omitting or simplifying redundancy.

The assemblies of frequency conversion chains or other items of microwave equipment are currently produced using hybrid technology, with redundancy centralized in the satellite.

The term "hybrid technology" is understood to mean an element comprising one or more insulated substrates, generally made of ceramic, on which active and passive components are interconnected with a view to performing an electrical function; the active components may be bare chips or packaged components, the passive components may be printed on the substrate or be components that are bonded and wired. In any case, the components are added by microelectronic bonding and wiring, unlike in the case of board technology which uses surface-mounted components, assembled by soldering on a printed circuit board.

For this type of equipment, the redundancy rings are produced using coaxial (generally tee-type) switches which are interconnected by a radiofrequency or RF harness (coaxial connectors and cable) and a DC (direct-current) harness.

These existing solutions use coaxial switches which are expensive (>€4k per switch) and heavy, even when they are incorporated in the form of an assembly. Additionally, the cost of integration of each switch in the payload is high.

SUMMARY OF THE INVENTION

One aim of the invention is to overcome the aforementioned problems, and in particular to limit the costs of the switches installed on board satellites as well as the cost of assembling, integrating and testing the redundancy rings.

Therefore, according to one aspect of the invention, a microwave switching device is provided comprising:

a switching matrix with M inputs and N outputs comprising at least one surface-mount microwave switch with ohmic contacts with at least one input and at least one output position;

a control bus for the one or more microwave switches of the switching matrix;

a remote-control bus for the M inputs;

a telemetry bus for the N outputs;

a bias tee positioned on each input of the bias matrix; and a bias tee positioned on each output of the bias matrix.

Such a device allows surface-mount components, which were developed for ground-based technologies, to be used for satellites and thus the associated costs to be lowered, by allowing the state of the switch to be read by telemetry, which is not provided for with ground-based technologies.

According to one embodiment, the one or more surface-mount microwave switches with ohmic contacts with at least one input and at least one output position are bistable electromechanical switches.

Thus, this configuration allows a DC signal to be superposed on the microwave signal at input and thus makes it possible to know the state of each microwave switch simply by measuring the DC voltage at output, which is not possible when the contacts are for example capacitive.

In one embodiment, at least one bias tee comprises one capacitor and one inductance coil.

According to one embodiment, at least one bias tee comprises two capacitors and one inductance coil.

In one embodiment, one bias tee capacitor may be replaced with a coupled line.

According to one embodiment, one bias tee inductance coil (L) may be replaced with a quarter-wave line.

According to one embodiment:

the switching matrix comprises a single surface-mount microwave switch with ohmic contacts with one input and two output positions or two surface-mount microwave switches with ohmic contacts with one input and one output position;

the bias tee positioned on the input of the bias matrix comprises an input LC circuit, comprising an input inductance coil and an input capacitor, and connected between the input inductance coil and the input capacitor to the input of the switch, the voltage at the output of the input inductance coil being representative of the state of the switch;

the bias tee positioned on the first output of the bias matrix comprises a first output LC circuit, comprising a first output inductance coil and a first output capacitor, which is connected, between the first output inductance coil and the first output capacitor, to the first output position of the switch, and the first output inductance coil of which is connected, at its end that is not linked to the first output capacitor, to a first voltage reference;

the bias tee positioned on the second output of the bias matrix comprises a second output LC circuit, comprising a second output inductance coil and a second output capacitor, which is connected, between the second output inductance coil and the second output capacitor, to the second output position of the one or more microwave switches, and the second output inductance coil of which is connected, at its end that is not linked to the second output capacitor, to a second voltage reference;

the control bus for the microwave switch of the switching matrix comprises a first portion comprising a first control inductance coil that is positioned in proximity to the first output position, and a second portion comprising a second control inductance coil that is positioned in proximity to the second output position, the first portion comprising a first control diode that is positioned in parallel to the first inductance coil (L1) forming an assembly that is connected on one side to a control voltage reference and connected on the other side to a first switch that is linked to ground, and the second portion comprising a second control diode that is positioned in parallel to the second inductance coil forming an assembly that is connected on one side to the control voltage reference and connected on the other side to a second switch that is linked to ground;

the capacitances of the input capacitor, of the first output capacitor and of the second output capacitor being identical; and the inductances of the input inductance coil, of the first output inductance coil and of the second output inductance coil being identical.

In one embodiment, the one or more microwave switches of the switching matrix are pulse controlled.

According to another aspect of the invention, a frequency conversion device for satellites is also provided, comprising a rack and at least one circuit board suitable for being positioned in the rack, the circuit board comprising at least one switching device according to one of the preceding aspects of the invention.

BRIEF DESCRIPTION OF THE DRAWINGS

The invention will be better understood on studying a few embodiments described by way of completely non-limiting examples and illustrated by the appended drawings, in which.

In the various figures, the elements that have the same references are identical.

DETAILED DESCRIPTION

Figure 1:
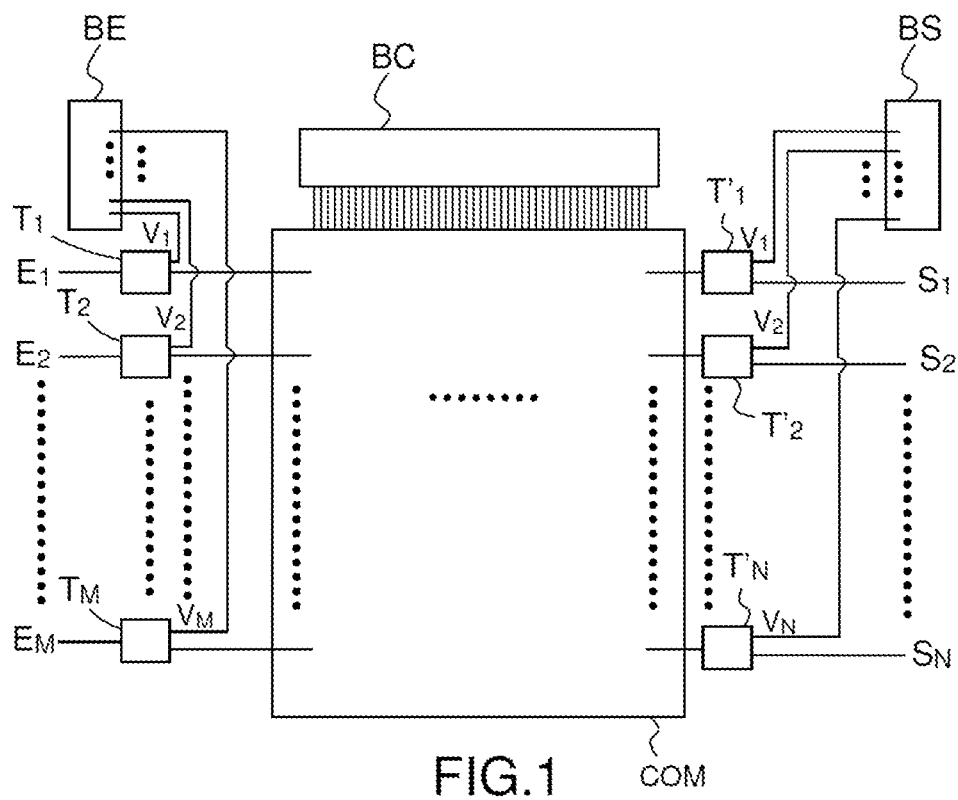
FIG. 1 schematically illustrates a microwave switching device, according to one aspect of the invention.

FIG. 1 shows a microwave switching device comprising:
a switching matrix COM with M inputs $E_1, E_2, \ldots E_M$ and N outputs $S_1, S_2, \ldots S_N$ comprising at least one surface-mount microwave switch with ohmic contacts, for example a bistable electromechanical switch, with at least one input and at least one output position;
a control bus BC for the one or more microwave switches of the switching matrix COM;
a remote-control bus BE for the M inputs $E_1, E_2, \ldots E_M$;
a telemetry bus BS for the N outputs $S_1, S_2, \ldots S_N$;
a bias tee $T_1, T_2, \ldots T_M$ positioned on each input $E_1, E_2, \ldots E_M$ of the switching matrix COM; and
a bias tee $T'_1, T'_2, \ldots T'_S$ positioned on each output $S_1, S_2, \ldots S_N$ of the switching matrix COM.

For a bias tee $T_1, T_2, \ldots T_M$ positioned on a respective input $E_1, E_2, \ldots E_M$ of the switching matrix COM, the RF+DC output is connected to the corresponding input of the switching matrix COM, the RF input receives the signal intended for the corresponding input of the switching matrix COM, and the DC input is connected to the telemetry bus BE for the M inputs $E_1, E_2, \ldots E_M$ making it possible to control the voltage $VT_i$ applied between ground and the DC input of the bias tee $T_1, T_2, \ldots T_M$ in the switching matrix without affecting the microwave performance of the switching matrix COM.

For a bias tee $T'_1, T'_2, \ldots T'_M$ positioned on a respective output $S_1, S_2, \ldots S_N$ of the switching matrix COM, the RF+DC input is connected to the corresponding output of the switching matrix COM, the RF output of the bias tee transmits the signal coming from the corresponding input of the switching matrix COM, and the DC output is connected to the telemetry bus BS for the N outputs $S_1, S_2, \ldots S_N$ making it possible to measure the voltage $VT_j$ read between ground and the DC output of the bias tee $T'_1, T'_2, \ldots T'_M$ in the switching matrix without affecting the microwave performance of the switching matrix COM.

It continues according to this principle for the M inputs and N outputs, the voltages $VT_j$ (j varying from 1 to N) are read and it is thus known to which inputs the N outputs are linked on the basis of the applied voltages $VT_i$ (i varying from 1 to M). Thus, if $VT_i$ is equal to $VT_j$, the input i is linked to the output j.

Figure 2:
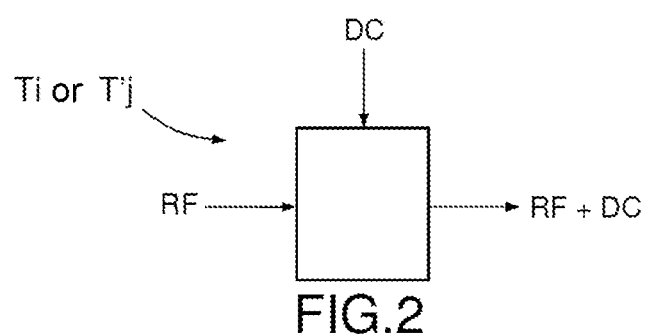
FIG. 2 illustrates a bias tee, according to one aspect of the invention.

FIG. 2 schematically shows a bias tee, receiving an RF channel and a DC channel as input and delivering RF+DC as output. This component allows a DC signal to be superposed on an RF signal in its configuration at the input of the matrix COM, or a dual function when it is used at the output of the matrix COM.

FIGS. 3 to 6 show various embodiments of a bias tee.

Figure 3:
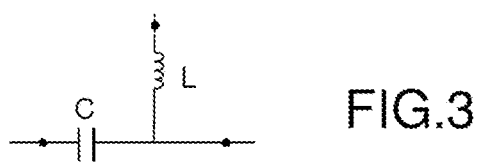
FIGS. 3 to 6 schematically illustrate embodiments of a bias tee.

FIG. 3 shows a bias tee comprising a capacitor C and an inductance coil L.

Figure 4:
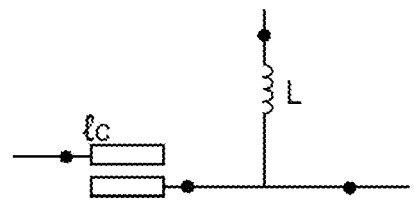

FIG. 4 shows a bias tee comprising a coupled line Ic and an inductance coil L.

Figure 5:
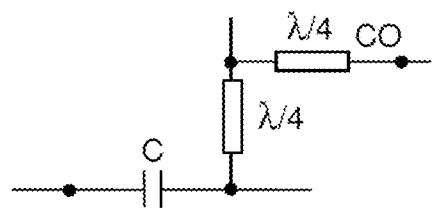

FIG. 5 shows a bias tee comprising a capacitor C and two quarter-wave lines λ/4 in series, of which the one at the end is in open circuit CO.

Figure 6:
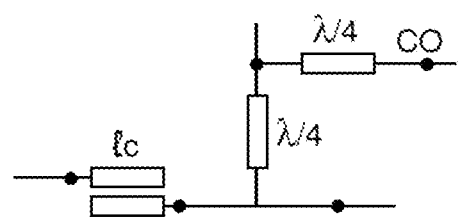

FIG. 6 shows a bias tee comprising a coupled line Ic and two quarter-wave lines λ/4 in series, of which the one at the end is in open circuit CO.

Figure 7:
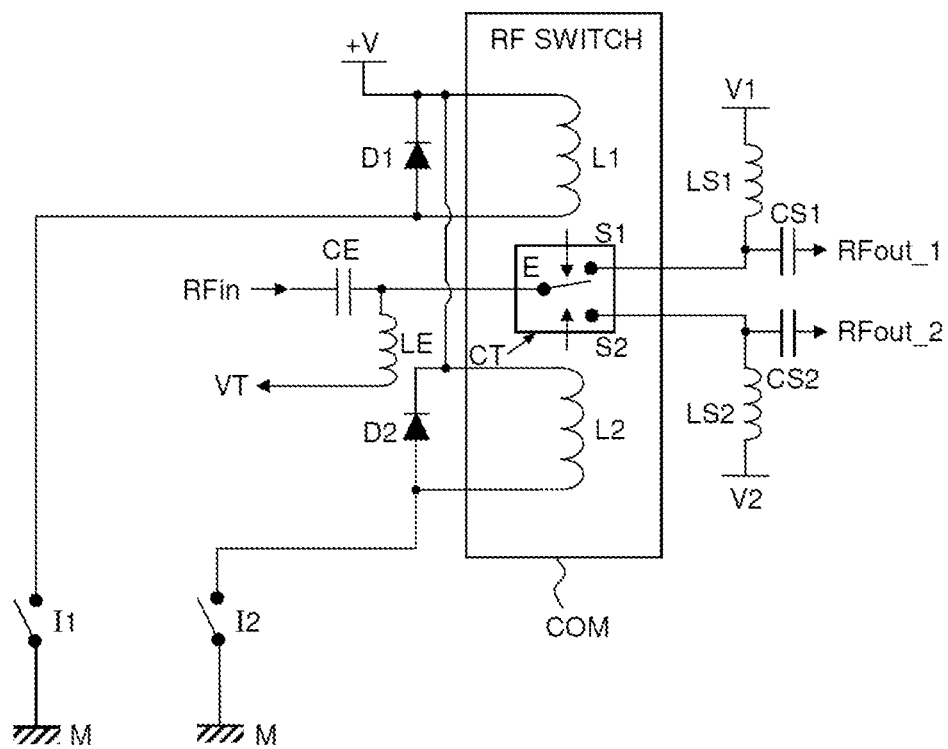
FIG. 7 schematically illustrates a switching matrix with one input and two outputs.

FIG. 7 shows a switching device according to one aspect of the invention, in which
the switching matrix COM comprises a single microwave switch CT with ohmic contacts, for example a surface-mount bistable electromechanical switch, with two output positions;
the bias tee positioned on the input of the bias matrix comprises an input LC circuit, comprising an input inductance coil LE and an input capacitor CE, and connected between the input inductance coil LE and the input capacitor CE to the input E of the microwave switch CT, the voltage VT at the output of the input inductance coil LE being representative of the state of the switch COM;
the bias tee positioned on the first output of the bias matrix comprises a first output LC circuit, comprising a first output inductance coil LS1 and a first output capacitor CS1, which is connected, between the first output inductance coil LS1 and the first output capacitor CS1, to the first output position S1 of the microwave switch CT, and the first output inductance coil LS1 of which is connected, at its end that is not linked to the first output capacitor CS1, to a first voltage reference V1;
the bias tee positioned on the second output of the bias matrix comprises a second output LC circuit, comprising a second output inductance coil LS2 and a second output capacitor CS2, which is connected, between the second output inductance coil LS2 and the second output capacitor CS2, to the second output position S2 of the microwave switch CT, and the second output inductance coil LS2 of which is connected, at its end that is not linked to the second output capacitor CS2, to a second voltage reference V2;

the control bus BC for the microwave switch CT of the switching matrix COM comprises a first portion comprising a first control inductance coil L1 that is positioned in proximity to the first output position S1, and a second portion comprising a second control inductance coil L2 that is positioned in proximity to the second output position S2, the first portion comprising a first control diode D1 that is positioned in parallel to the first inductance coil L1 forming an assembly that is connected on one side to a control voltage reference V and connected on the other side to a first switch I1 that is linked to ground M, and the second portion comprising a second control diode D2 that is positioned in parallel to the second inductance coil L2 forming an assembly that is connected on one side to the control voltage reference V and connected on the other side to a second switch I2 that is linked to ground M;

the capacitances of the input capacitor CE, of the first output capacitor CS1 and of the second output capacitor CS2 being identical; and the inductances of the input inductance coil LE, of the first output inductance coil LS1 and of the second output inductance coil LS2 being identical.

As a variant, the switching matrix COM may comprise two microwave switches CT with ohmic contacts with one input and one output position, for example surface-mount bistable electromechanical switches.

The control bus BC for the microwave switch CT of the switching matrix COM comprises a first portion comprising a first control inductance coil L1 that is positioned in proximity to the first output position S1, and a second portion comprising a second control inductance coil L2 that is positioned in proximity to the second output position S2.

The first portion comprises a first control diode D1 that is positioned in parallel to the first inductance coil L1 forming an assembly that is connected on one side to a control voltage reference V and connected on the other side to a first switch I1 that is linked to ground M.

The second portion comprises a second control diode D2 that is positioned in parallel to the second inductance coil L2 forming an assembly that is connected on one side to the control voltage reference V and connected on the other side to a second switch I2 that is linked to ground M.

The inductance coils are preferably pulse-controlled coils to minimize the electrical consumption of the switching device, but they may also be static coils.

The microwave switches used, employing surface-mount technology and referred to as surface-mount components (SMCs), allow costs to be limited in comparison with the specific electromechanical switches currently used.

The voltage V required to switch the microwave switch CT may be 12 V, and the first and second control diodes D1 and D2 may be diodes referred to as flyback diodes, or any other device allowing the transient voltage appearing across the terminals of the coil L1 and L2 upon closure of the switches I1 or I2 to be limited.

When the second switch I2 is closed, the second inductance coil L2 is biased to the control voltage reference V, resulting in the microwave switch CT switching to the second output position S2, and the output voltage RFout_2 of the switching device is then equal to the input voltage RFin.

When the first switch I1 is closed, the first inductance coil L1 is biased to the control voltage reference V, resulting in the microwave switch CT switching to the first output position S1, and the output voltage RFout_1 of the switching device is then equal to the input voltage RFin.

The voltage VTm at the output of the input inductance coil LE is a telemetry signal that is representative of the state of the microwave switch CT.

When the switch CT is in the first output position S1, the voltage VTmi is equal to the first voltage reference V1, which is higher than or equal to the threshold voltage VIH corresponding to the high logic level. For example V1=2.5 V if VIH=2 V.

When the microwave switch CT is in the second output position S2, the voltage $VTm_1$ is equal to the second voltage reference V2, which is lower than or equal to the threshold voltage VIL corresponding to the low logic level. For example V2=0.5 V if VIL=0.8 V.

The input LE, first output LS1 and second output LS2 inductance coils, of identical value, prevent the RF signal from being coupled to the DC reference V1 and V2 and output of the input inductance VT voltages.

The input CE, first output C1 and second output C2 capacitors, of identical value, prevent a DC signal from being superposed on the input RFin and output RFout_1 and RFout_2 microwave lines.

The capacitances CE, CS1 and CS2 have identical values and the inductances LE, L1 and L2 have identical values, which depend on the frequency f and on its bandwidth delta f. The frequency f is the operating frequency of the switching matrix COM.

First, these values are determined for a transmission line configuration, having a characteristic line impedance Z0. By convention this value is generally set at 50 ohms.

The impedance Xc of the capacitance and XL of the inductance are chosen to have low values and a high value, respectively, with respect to the characteristic line inductance Z0. They satisfy the below equations where w is the pulse in rad/s and f is the operating frequency in hertz.

In this approach, it is assumed that the capacitance and inductance are ideal and hence without parasitic elements.

$$X_C = \frac{1}{\omega C} = \frac{1}{2\pi f C} \ll Z_0,$$

$$X_L = \omega L = 2\pi f L \gg Z_0,$$

In the figures of the present application, the provided examples of the switching matrix COM show it with microwave switches CT with one input and two output positions, since these are the most common, but of course, as a variant, the switching matrix COM may be produced in numerous different ways with microwave switches CT which differ in terms of number of inputs and number of outputs.

Figure 8:
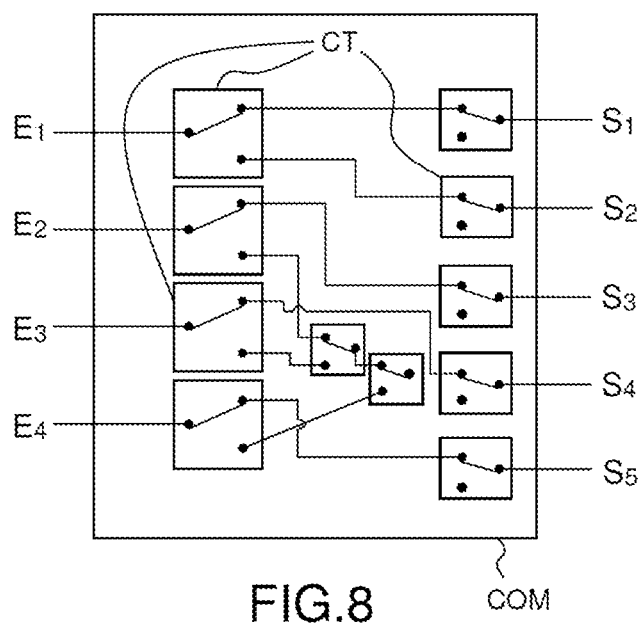
FIG. 8 schematically shows an exemplary switching matrix with four inputs and five outputs.
Figure 9:
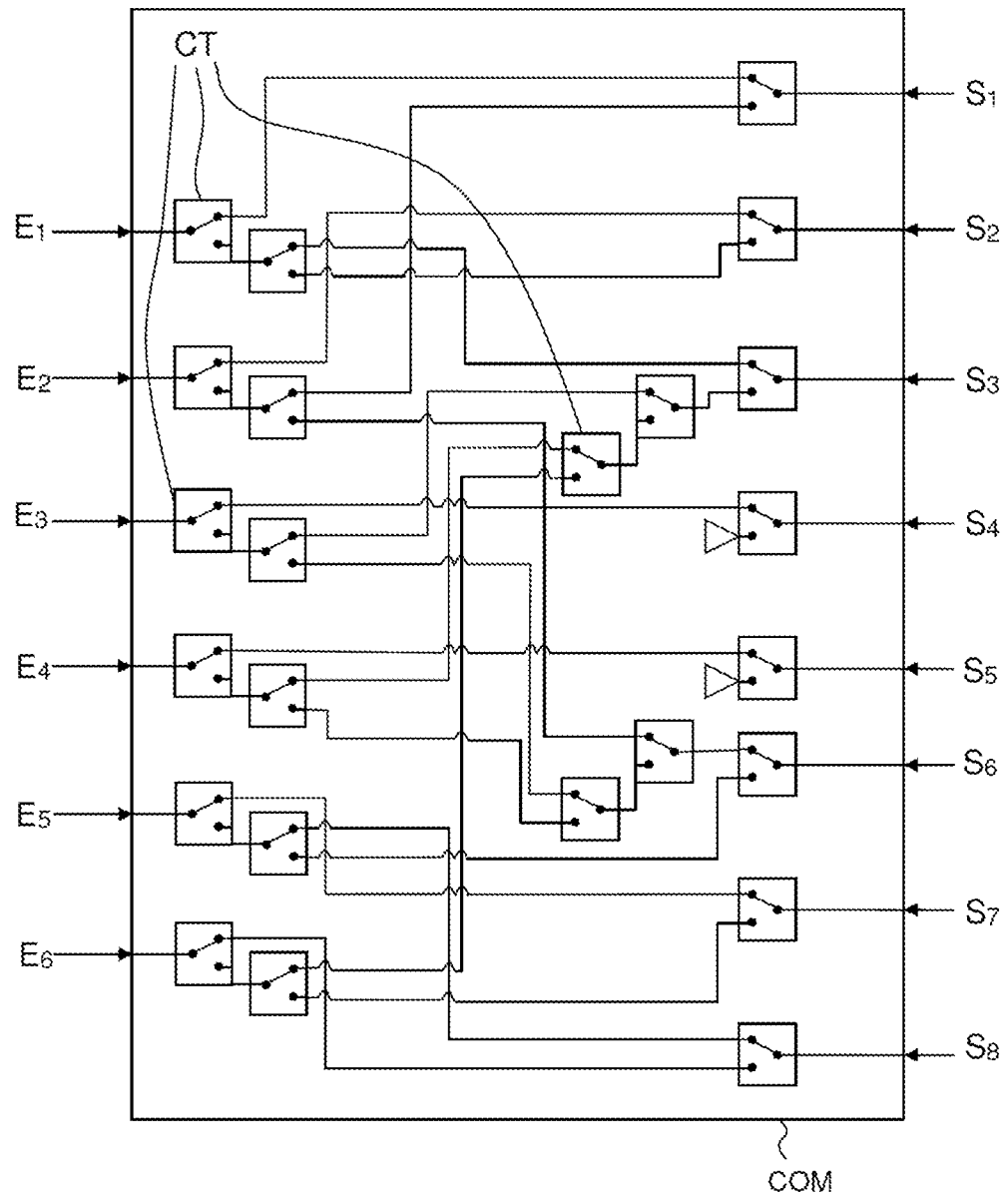
FIG. 9 schematically shows an exemplary switching matrix with six inputs and eight outputs.

FIG. 8 schematically shows an exemplary switching matrix with four inputs and five outputs, and FIG. 9 schematically shows an exemplary switching matrix COM with six inputs and eight outputs.

Figure 10:
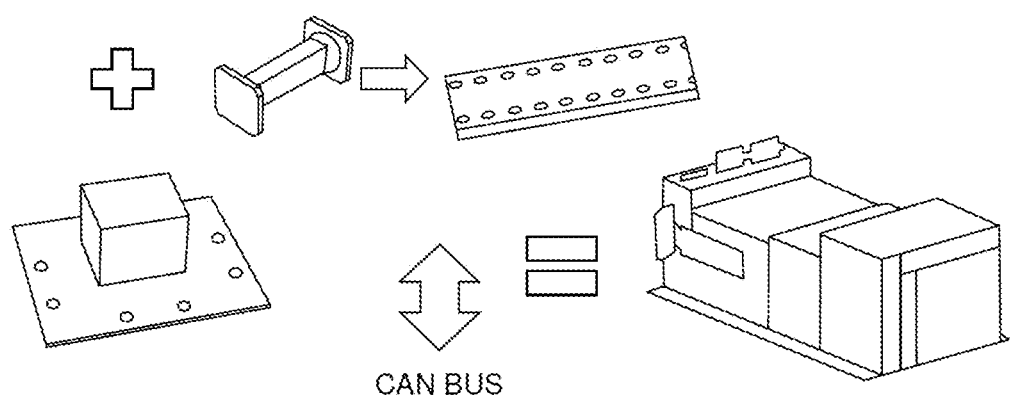
FIG. 10 illustrates a rack comprising at least one circuit board provided with at least one microwave switching device, according to one aspect of the invention.

FIG. 10 schematically shows, on the left, the surface-mount bistable electromechanical microwave switch CT on a circuit board, a waveguide produced normally using conventional technology by machining a metal bar, which is used in the invention as a waveguide incorporated in the circuit board, thereby allowing the switching matrix to be produced by connecting the microwave switches CT. Thus, by using switching devices according to the invention, this allows a meta-device to be produced, shown on the right in the form of a rack (RACK) comprising at least one circuit board suitable for being positioned on the rack, the circuit board comprising at least one switching device according to the invention, and the waveguides incorporated in the circuit board.

The invention claimed is:

1. A microwave switching device comprising:
   a switching matrix with M inputs and N outputs comprising at least one surface-mount microwave switch with ohmic contacts with at least one input and at least one output position;
   a control bus for the one or more microwave switches of the switching matrix;
   a remote-control bus for the M inputs;
   a telemetry bus for the N outputs;
   a bias tee positioned on each input of the switching matrix; and
   a bias tee positioned on each output of the switching matrix.

2. The device according to claim 1, wherein the one or more surface-mount microwave switches with ohmic contacts with at least one input and at least one output position are bistable electromechanical switches.

3. The microwave switching device according to claim 1, wherein at least one bias tee comprises one capacitor and one inductance coil.

4. The microwave switching device according to claim 1, wherein at least one bias tee comprises two capacitors and one inductance coil.

5. The switching device according to claim 1, wherein one bias tee capacitor may be replaced with a coupled line.

6. The switching device according to claim 1, wherein one bias tee inductance coil may be replaced with a quarter-wave line (λ/4).

7. The microwave switching device according to claim 1, wherein:
   the switching matrix comprises a single surface-mount microwave switch with ohmic contacts with one input and two output positions or two surface-mount switches with ohmic contacts with one input and one output position;
   the bias tee positioned on the input of the bias matrix comprises an input LC circuit, comprising an input inductance coil and an input capacitor, and connected between the input inductance coil and the input capacitor to the input of the microwave switch, the voltage at the output of the input inductance coil being representative of the state of the microwave switch;
   the bias tee positioned on the first output of the bias matrix comprises a first output LC circuit, comprising a first output inductance coil and a first output capacitor, which is connected, between the first output inductance coil and the first output capacitor, to the first output position of the microwave switch, and the first output inductance coil of which is connected, at its end that is not linked to the first output capacitor, to a first voltage reference;
   the bias tee positioned on the second output of the bias matrix comprises a second output LC circuit, comprising a second output inductance coil and a second output capacitor, which is connected, between the second output inductance coil and the second output capacitor, to the second output position of the microwave switch, and the second output inductance coil of which is connected, at its end that is not linked to the second output capacitor, to a second voltage reference;
   the control bus for the microwave switch of the switching matrix comprises a first portion comprising a first control inductance coil that is positioned in proximity to the first output position, and a second portion comprising a second control inductance coil that is positioned in proximity to the second output position, the first portion comprising a first control diode that is positioned in parallel to the first inductance coil forming an assembly that is connected on one side to a control voltage reference and connected on the other side to a first switch that is linked to ground, and the second portion comprising a second control diode that is positioned in parallel to the second inductance coil forming an assembly that is connected on one side to the control voltage reference and connected on the other side to a second switch that is linked to ground;
   the capacitances of the input capacitor, of the first output capacitor and of the second output capacitor being identical; and the inductances of the input inductance coil, of the first output inductance coil and of the second output inductance coil being identical.

8. The switching device according to claim 1, wherein the one or more microwave switches of the switching matrix are pulse controlled.

9. A device for satellites comprising a rack and at least one circuit board suitable for being positioned in the rack, the circuit board comprising at least one switching device according to claim 1.

* * * * *